United States Patent
Lee et al.

(10) Patent No.: US 8,362,621 B2
(45) Date of Patent: Jan. 29, 2013

(54) MICROELECTRONIC DEVICES INCLUDING MULTIPLE THROUGH-SILICON VIA STRUCTURES ON A CONDUCTIVE PAD AND METHODS OF FABRICATING THE SAME

(75) Inventors: Ho Jin Lee, Seoul (KR); Dong Hyeon Jang, Gyeonggi-do (KR); Nam Seog Kim, Gyeonggi-do (KR); In Young Lee, Gyeonggi-do (KR); Ha Young Yim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1009 days.

(21) Appl. No.: 12/393,109

(22) Filed: Feb. 26, 2009

(65) Prior Publication Data
US 2010/0090338 A1    Apr. 15, 2010

(30) Foreign Application Priority Data
Oct. 15, 2008   (KR) .................. 10-2008-0101129

(51) Int. Cl.
*H01L 23/522*   (2006.01)
*H01L 25/11*   (2006.01)

(52) U.S. Cl. ... 257/774; 257/77; 257/786; 257/E23.145; 257/E21.585

(58) Field of Classification Search .................. 257/774, 257/777, E25.027, E23.145, E21.585; 438/666
See application file for complete search history.

(56) References Cited

U.S. PATENT DOCUMENTS

| | | | |
|---|---|---|---|
| 6,448,661 B1 | 9/2002 | Kim et al. | |
| 8,178,980 B2 * | 5/2012 | Jeng et al. | ..................... 257/786 |
| 2006/0125573 A1 * | 6/2006 | Brunette et al. | ................ 333/33 |
| 2008/0036082 A1 | 2/2008 | Eun | |
| 2008/0211081 A1 | 9/2008 | Lee | |

FOREIGN PATENT DOCUMENTS

JP   03896038 B2   3/2007

* cited by examiner

*Primary Examiner* — Roy Potter
(74) *Attorney, Agent, or Firm* — Myers Bigel Sibley & Sajovec, P.A.

(57) ABSTRACT

A microelectronic structure includes a conductive pad on a substrate. The conductive pad includes first and second openings extending therethrough. A first conductive via on the conductive pad extends through the first opening in the conductive pad into the substrate. A second conductive via on the conductive pad adjacent the first conductive via extends through the second opening in the conductive pad into the substrate. At least one of the conductive vias may be electrically isolated from the conductive pad. Related devices and fabrication methods are also discussed.

30 Claims, 13 Drawing Sheets

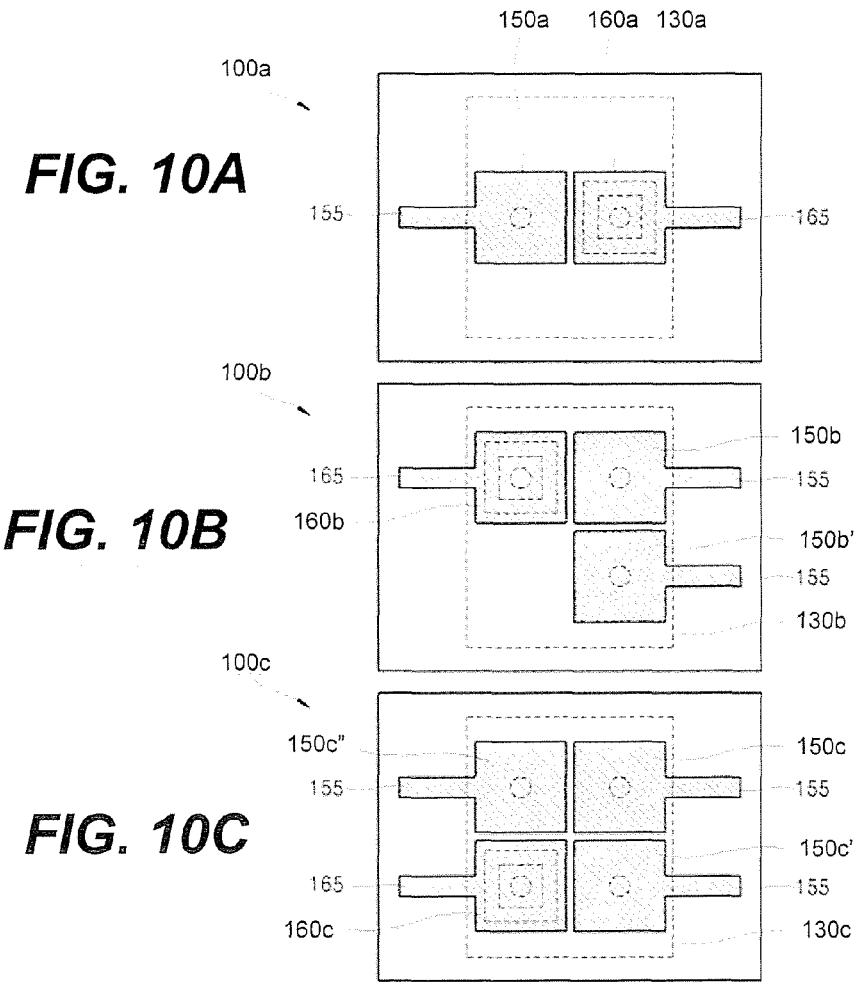
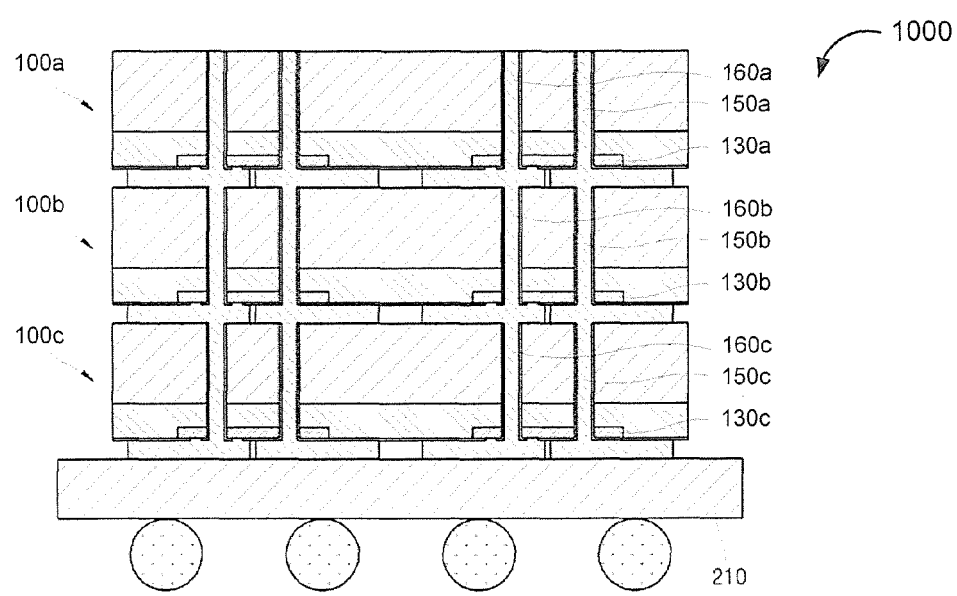

MICROELECTRONIC DEVICES INCLUDING MULTIPLE THROUGH-SILICON VIA STRUCTURES ON A CONDUCTIVE PAD AND METHODS OF FABRICATING THE SAME

CROSS-REFERENCE TO RELATED APPLICATION

The present application claims priority to Korean Patent Application No. 10-2008-0101129, filed in the Korean Intellectual Property Office on Oct. 15, 2008, the disclosure of which is incorporated by reference herein in its entirety.

FIELD OF THE INVENTION

The present invention relates to the field of microelectronic devices in general, and more particularly, to microelectronic structures including through-silicon-via (TSV) structures and related fabrication methods.

BACKGROUND

Advances in device integration technology have led to the development of a three-dimensional stacked LSI approach, in contrast to the conventional two-dimensional LSI approach. Some types of three dimensional integration include package stacking, die stacking, and wafer stacking. Among wafer stacking approaches, a technique called Through-Silicon-Via (TSV) can be used to extend a via hole through a substrate so that a conductive electrode or via may be formed that completely penetrates the substrate, creating vertical connections through the body of a chip. In turn, multiple substrates including TSVs can be stacked on one another to achieve three dimensional integration. In particular, the TSVs of different substrates can conduct signals from one substrate to another without the need to use, for example, wires.

Two approaches that can be used in the formation of TSVs include a "via first" approach and a "via last" approach. According to a via first approach, TSVs are formed through the substrate before back end processing, such that vias can be formed in the substrates to only partially penetrate the entire substrate. According to the via last approach, the vias can be formed after the back end processing and/or after a bonding process. Subsequently, the substrates can be thinned and bound together to achieve a three-dimensional stacked structure.

TSV structures are also discussed in, for example, in the following documents: U.S. Patent Application Publication No. 2008/0036082; U.S. Patent Application Publication No. 2008/0211081; and Japanese Patent No. 3896038.

SUMMARY

According to some embodiments of the present invention, a microelectronic structure includes a substrate and a conductive pad on the substrate. The conductive pad includes first and second openings extending therethrough. A first conductive via on the conductive pad extends through the first opening in the conductive pad and into the substrate. A second conductive via on the conductive pad adjacent the first conductive via extends through the second opening in the conductive pad and into the substrate.

In some embodiments, the structure may include an insulating layer on the conductive pad between the conductive pad and the first and second conductive vias. The first conductive via may be electrically isolated from the conductive pad by the insulating layer. Also, in some embodiments, the second conductive via may be electrically isolated from the conductive pad by the insulating layer.

In other embodiments, the insulating layer may expose a portion of the conductive pad adjacent the second opening, and the second conductive via may be electrically connected to the exposed portion of the conductive pad. For example, the exposed portion of the conductive pad may have a square shape, a circular shape, a hexagonal shape, or a ring shape in plan view.

In some embodiments, the structure may further include a third conductive via adjacent the first and second conductive vias on the conductive pad and extending through a third opening in the conductive pad into the substrate. The third conductive via may be electrically isolated from the conductive pad by the insulating layer.

In other embodiments, the first and/or second conductive vias may include a vertically extending portion that may extend through the conductive pad and into the substrate, and a laterally extending portion that may extend along a surface of the conductive pad outside the first and/or second opening. The structure may further include a conductive bump on at least one of the first and second conductive vias. The conductive bump may have a greater ductility than that of the first and second conductive vias.

In some embodiments, the first and/or second conductive vias may not extend completely through the substrate. In other embodiments, the first and/or second conductive vias may extend completely through the substrate. For example, an exposed portion of the first and/or second conductive vias may protrude from a surface of the substrate opposite the conductive pad.

In other embodiments, the first and/or second openings in the conductive pad may be a tapered opening extending into the substrate.

According to other embodiments of the present invention, a multi-chip module includes a module substrate and a first semiconductor chip on the module substrate. The first semiconductor chip includes a first conductive pad on a first substrate, and first and second openings extending through the first conductive pad and the first substrate. A first conductive via on the conductive pad extends through the first opening to provide an electrical connection to the module substrate. A second conductive via on the conductive pad adjacent the first conductive via extends through the second opening to provide an electrical connection to the module substrate.

In some embodiments, the first conductive via may be electrically isolated from the first conductive pad, and the second conductive via may be electrically connected to the first conductive pad.

In other embodiments, the module may further include a second semiconductor chip on the first semiconductor chip. The second semiconductor chip may include a second conductive pad on a second substrate, and a third opening extending through the second conductive pad and the second substrate. The first conductive via may further extend through the third opening, and may be electrically connected to the second conductive pad.

In some embodiments, the first semiconductor chip may include a fourth opening extending through the first conductive pad and the first substrate, and the second semiconductor chip may include a fifth opening extending through the second conductive pad and the second substrate. The module may further include a third semiconductor chip on the second semiconductor chip. The third semiconductor chip may include a third conductive pad on a third substrate, and a sixth opening extending through the third conductive pad and the third substrate. A third conductive via may extend through the fourth, fifth, and sixth openings in the first, second, and third semiconductor substrates, respectively, to provide an electrical connection to the module substrate.

In some embodiments, the module may be embodied in a system-in-package, memory card, and/or other system. The system may further include a processor, an input/output device, and a bus configured to provide communication there between.

According to further embodiments of the present invention, a method of fabricating an integrated circuit device includes forming a conductive pad on a substrate. First and second openings are formed extending through the conductive pad and into the substrate. A first conductive via is formed on the conductive pad. The first conductive via extends through the first opening in the conductive pad and into the substrate. A second conductive via is formed on the conductive pad adjacent the first conductive via. The second conductive via extends through the second opening in the conductive pad and into the substrate.

In some embodiments, prior to forming the first and second conductive vias, an insulating layer may be formed on a surface of the conductive pad and on opposing sidewalls of the first and second openings. The first conductive via may be formed on the insulating layer such that the insulating layer electrically isolates the first conductive via from the conductive pad. Also, the second conductive via may be formed on the insulating layer such that the insulating layer electrically isolates the second conductive via from the conductive pad.

In other embodiments, prior to forming the second conductive via, the insulating layer may be patterned to expose a surface of the conductive pad adjacent the second opening in the conductive pad. The second conductive via may be formed on the exposed surface of the conductive pad and electrically connected thereto.

In some embodiments, a third opening may be formed in the conductive pad and extending into the substrate. A third conductive via may be formed on the insulating layer adjacent the first and second conductive vias. The third conductive via may extend through the third opening into the substrate. The third conductive via may be electrically isolated from the conductive pad by the insulating layer.

In other embodiments, the first and/or second conductive vias may be formed to respectively include a vertically extending portion that may extend through the conductive pad and into the substrate, and a laterally extending portion that may extend along a surface of the conductive pad.

In some embodiments, a portion of a surface of the substrate opposite the conductive pad may be removed such that the first conductive via and/or the second conductive via may extend completely through the substrate.

BRIEF DESCRIPTION OF THE DRAWINGS

FIGS. 10A-10C are plan views illustrating semiconductor chips in a multi-chip module including semiconductor device structures according to yet other embodiments of the present invention.

FIG. 10D is a cross-sectional view illustrating the multi-chip module that includes the chips of FIGS. 10A-10C.

DETAILED DESCRIPTION OF EMBODIMENTS OF THE INVENTION

Figure 1A:
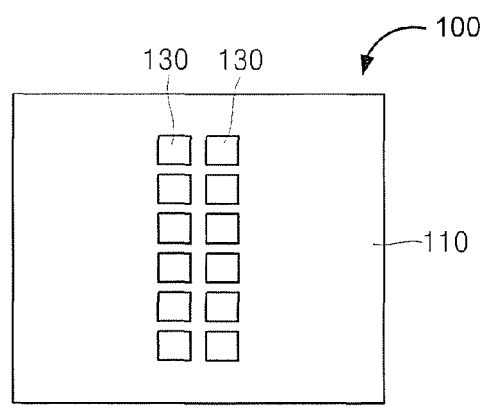
FIGS. 1A-1B are plan views illustrating microelectronic device structures according to some embodiments of the present invention.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated elements and/or components, but do not preclude the presence or addition of one or more other elements, components, and/or groups thereof. As used herein the expression "and/or" includes any and all combinations of one or more of the associated listed items.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than an abrupt change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

Some embodiments of the present invention arise from realization that, as device integration increases, managing signal routing for multiple chips stacked on a common substrate may be difficult. Accordingly, some embodiments of the present invention provide multiple conductive vias extending through a same conductive pad, such as a contact pad used to for power, input/output, testing, etc. As such, an upper chip having a greater number of contact pads may be connected to a substrate through a lower chip having fewer contact pads by using more than one via per pad. Embodiments of the present invention include semiconductor chips including at least two TSVs on one conductive pad, stack modules including such semiconductor chips, memory cards including such semiconductor chips, systems including such semiconductor chips, and methods of fabricating such semiconductor chips.

Figure 1B:
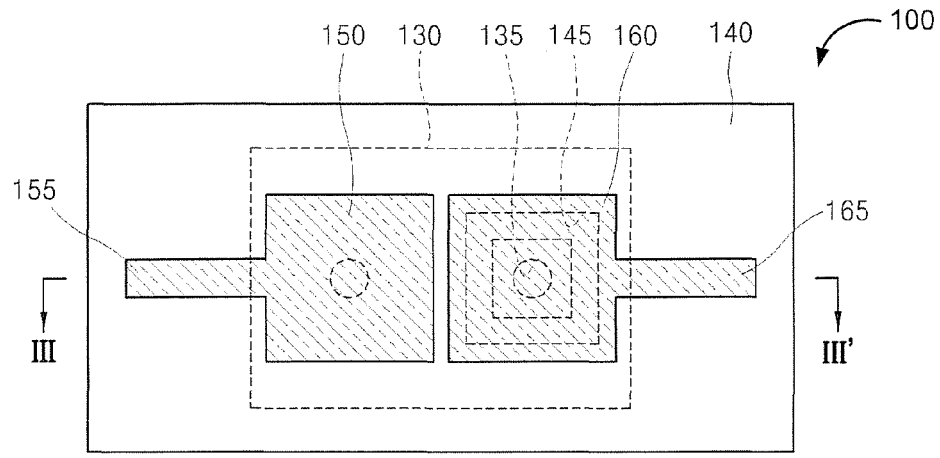
Figure 1C:
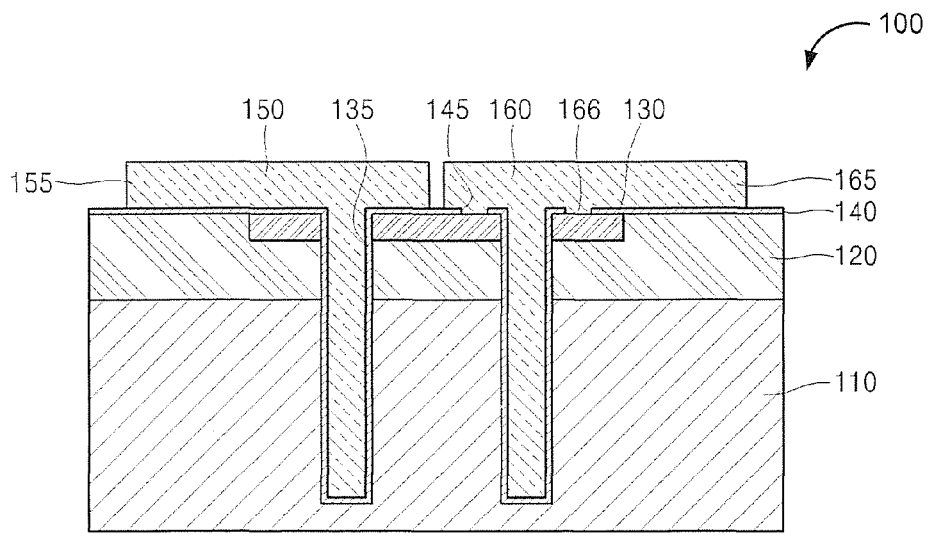
FIG. 1C is a cross-sectional view illustrating the microelectronic device structure of FIG. 1B.

FIGS. 1A-1C illustrate TSV structures according to some embodiments of the present invention. As shown in FIG. 1A, a semiconductor chip 100 may include a substrate 110 and a plurality of conductive pads 130 on the substrate 110. The conductive pads 130 may be arranged at a central region of the substrate 110 in some embodiments; however other arrangements (for example, at edges of the substrate 110) may also be used. The conductive pads 130 may be provided on an insulation layer 120, and at least an upper surface of each conductive pad 130 may be exposed by the insulation layer 120. The insulation layer 120 may be an oxide layer, a nitride layer, and/or a dielectric layer.

FIG. 1B illustrates an enlarged view of a conductive pad 130, while FIG. 1C is a cross-sectional view taken along line III-III' of FIG. 1B. As shown in FIGS. 1B and 1C, at least two conductive vias 150 and 160 may extend through openings in the conductive pad 130 and through via holes 135 into the semiconductor substrate 110. Each of the conductive vias 150 and 160 includes a vertically extending portion that extends through the conductive pad 130 into the substrate 110, and a laterally extending portion that extends along a surface of the conductive pad 130 outside the openings therein. The laterally extending portions of the conductive vias 150 and 160 are further connected to respective redistribution lines 155 and 165, which extend along the surface of the substrate 110 and/or the insulation layer 120 and may provide electrical connections to other elements. The conductive vias 150 and 160 do not extend completely through the substrate 110 as shown in FIG. 1C, but may extend through the substrate 110 after subsequent processing.

The first conductive via 150 is electrically isolated from the conductive pad 130, and thus, may not be used to transmit a signal from the semiconductor chip 100 via the conductive pad 130. More particularly, as shown in FIG. 1C, an insulating separation layer 140 is provided between the conductive vias 150 and 160 and the conductive pad 130, which electrically isolates the first conductive via 150 from the pad 130. The separation layer 140 may be a silicon dioxide layer, a polymer layer, or other insulating layer. In some embodiments, the separation layer 140 may have a thickness of about 1 micron (micrometer) or less. Accordingly, the first conductive via 150 may serve as a relay or bypass line, and may relay a signal from another semiconductor chip via the semiconductor chip 100 in a three-dimensional multi-chip module. However, a portion 166 of the second conductive via 160 is electrically connected to a portion 145 of the conductive pad 130 exposed by the separation layer 140. The portion 145 of the conductive pad 130 exposed by the separation layer 140 is illustrated in FIG. 1B as a rectangular ring in plan view.

Figure 2A:
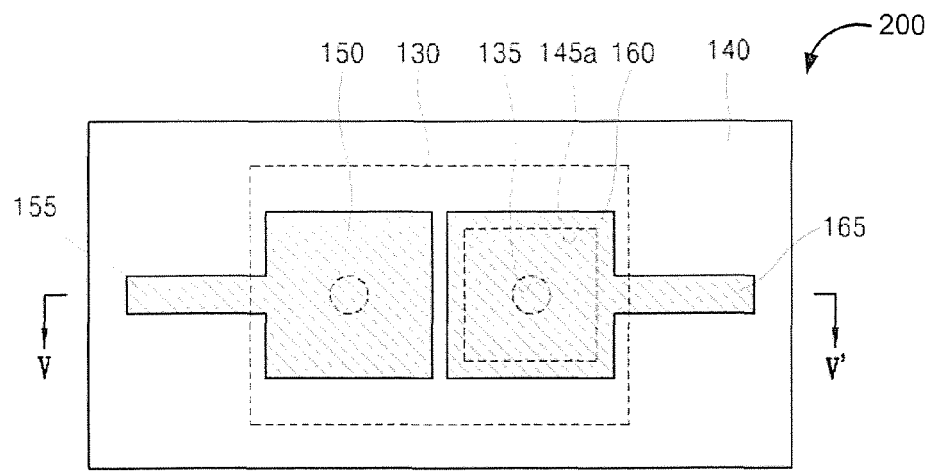
FIGS. 2A and 2C are plan views illustrating microelectronic device structures according to other embodiments of the present invention.
Figure 2B:
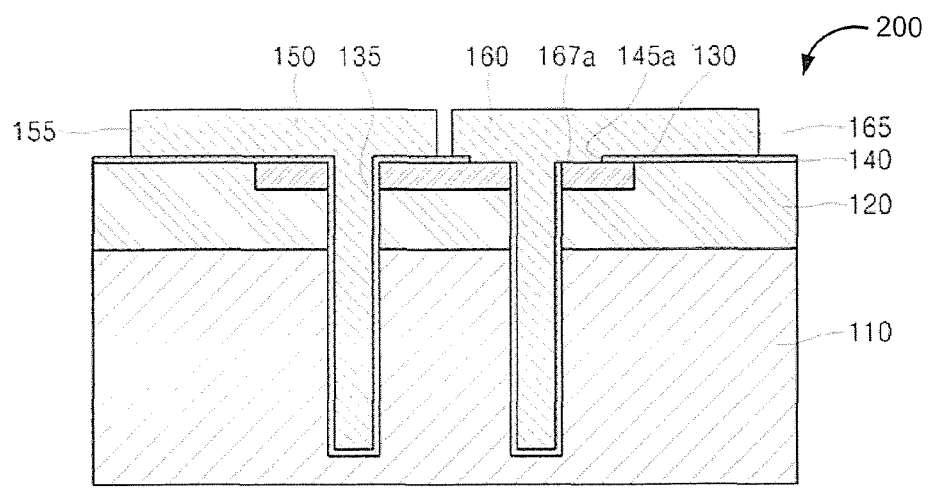
FIG. 2B is a cross-sectional view illustrating the microelectronic device structure of FIG. 2A.
Figure 2C:
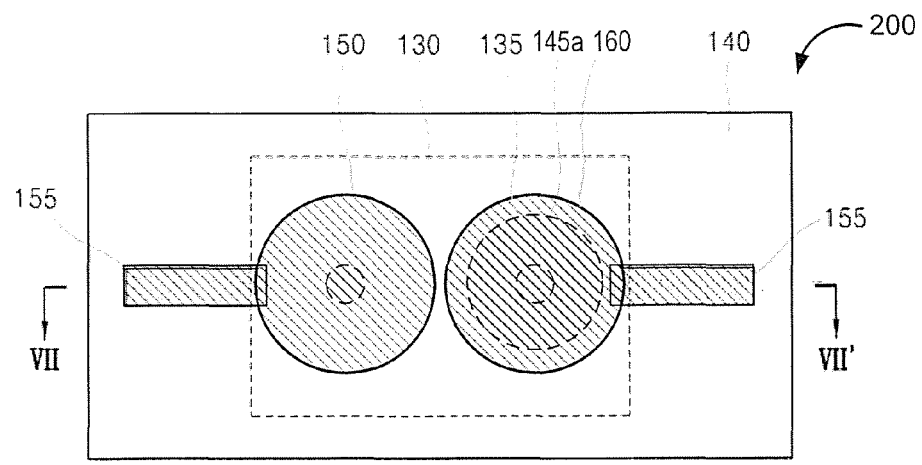

FIGS. 2A-2C illustrate TSV structures according to other embodiments of the present invention. As shown in FIGS. 2A and 2B, a semiconductor chip 200 includes an insulating separation layer 140 between the semiconductor substrate 110 and the first conductive via 150, and in particular, between the conductive pad 130 and first conductive via 150 to electrically isolate the first conductive via 150 from the conductive pad 130. A first redistribution line 155 is provided on the semiconductor substrate 110, and laterally extends along the surface of the substrate 110 to connect to the first conductive via 150. Likewise, a second redistribution line 165 laterally extends along the surface of the substrate 110 to connect to the second conductive via 160. The redistribution lines 155 and/or 165 may be routed irrespective of the position of the conductive pad 130. However, it is to be understood that the redistribution lines 155 and/or 165 may be omitted in some embodiments.

Still referring to FIGS. 2A-2B, a portion 167a of the second conductive via 160 is electrically connected to a portion 145a of the conductive pad 130 exposed by the separation layer 140, and is not in electrical contact with the first conductive via 150. As shown in FIG. 2A, the exposed portion 145a of the conductive pad 130 has a square shape in plan view. However, it is to be understood that the exposed portions 145a of the contact pad 130 (as well as the exposed portion 145 in FIG. 1B) may include any shape that allows for electrical contact with the underlying conductive pad 130, for example, hexagonal, circular, elliptical, or ring shapes. Accordingly, the second conductive via 160 may be used to transmit a signal from the semiconductor chip 200 via the conductive pad 130. Thus, where one of the semiconductor chips in a multi-chip module may have an insufficient number of pads 130 for signal transmission, embodiments of the present invention can allow multiple signals to be transmitted through the same conductive pad 130 by providing the first conductive via 150 and the second conductive via 160 extending therethrough.

FIG. 2C illustrates a TSV structure similar to that of FIG. 2A, except that the first and second conductive vias 150 and 160 are circularly-shaped. Likewise, the exposed portion 145a of the contact pad 130, which is electrically connected to the second conductive via 160, also has a circular shape in plan view.

Figure 3A:
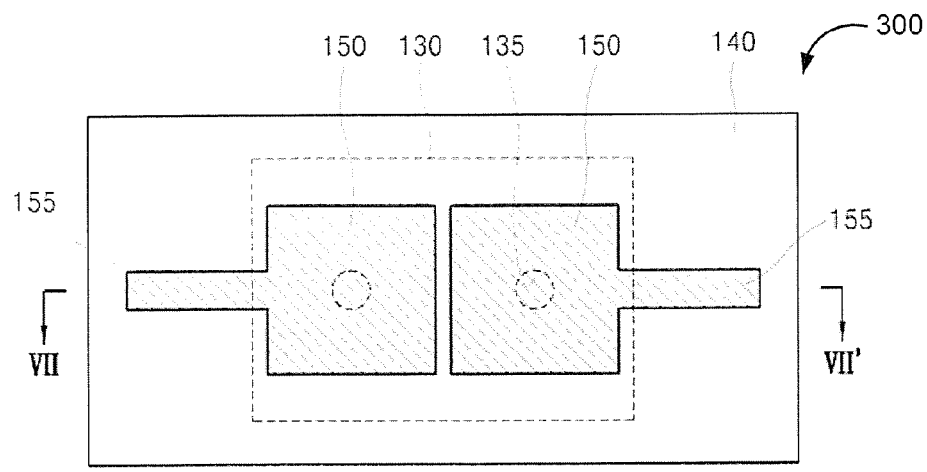
FIGS. 3A and 3C are plan views illustrating microelectronic device structures according to further embodiments of the present invention.
Figure 3B:
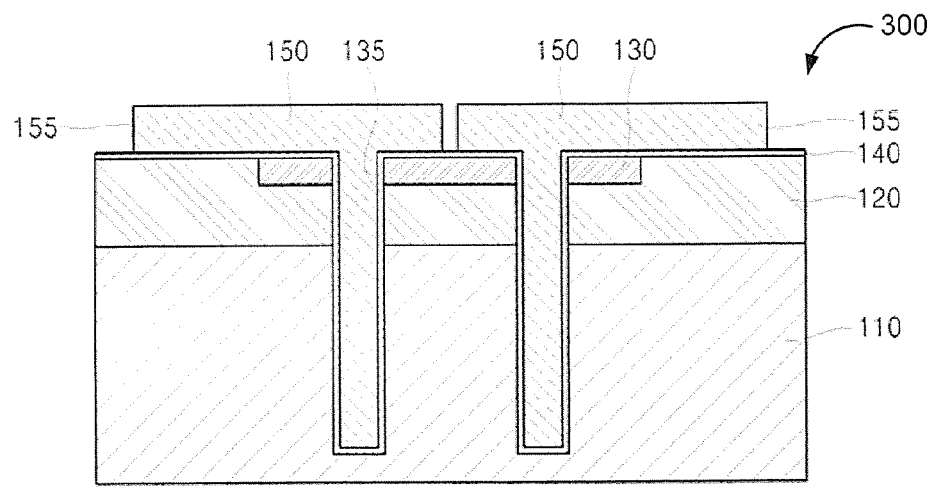
FIG. 3B is a cross-sectional view illustrating the microelectronic device structure of FIG. 3A.
Figure 3C:
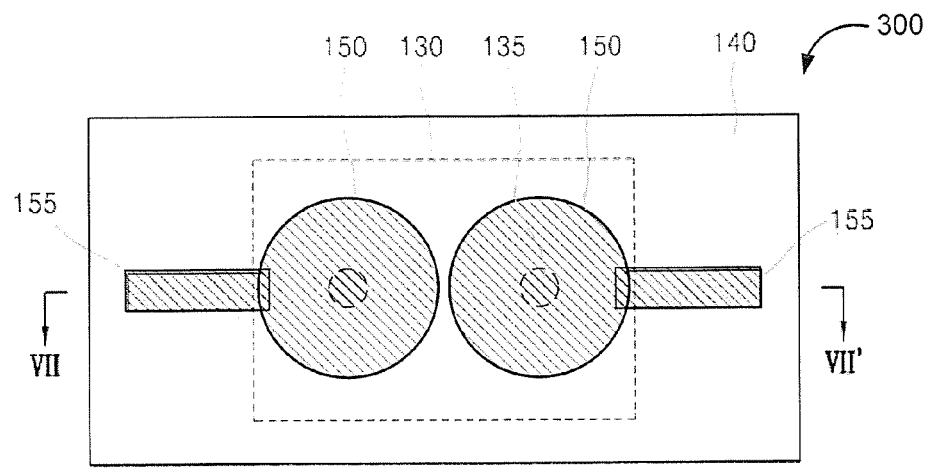

FIGS. 3A-3C illustrate TSV structures according to further embodiments of the present invention. As shown in FIGS. 3A and 3B, a semiconductor chip 300 includes two conductive vias 150 extending through openings in the conductive pad 130 into the semiconductor substrate 110. An insulating separation layer 140 extends between the between the conductive pad 130 and conductive vias 150 to electrically isolate both of the conductive vias 150 from the conductive pad 130. FIG. 3C illustrates a TSV structure similar to that of FIG. 3A, except that the conductive vias 150 are circularly-shaped. Accordingly, neither of the conductive vias 150 are electrically connected to the conductive pad 130. For example, the conductive pad 130 of FIGS. 3A-3C may be a test pad used for testing the semiconductor chip 300 during manufacturing, rather than for connection with another device. As such, an electrical connection with the conductive pad 130, such as that provided by the conductive vias 160 of FIGS. 1A-2C, may not be required in the embodiments of FIGS. 3A-3C. Also, although only two conductive vias per conductive pad 130 are illustrated in FIGS. 1A-3C, it is to be understood that additional vias may be provided in each pad 130, as described in detail below.

Figure 4A:
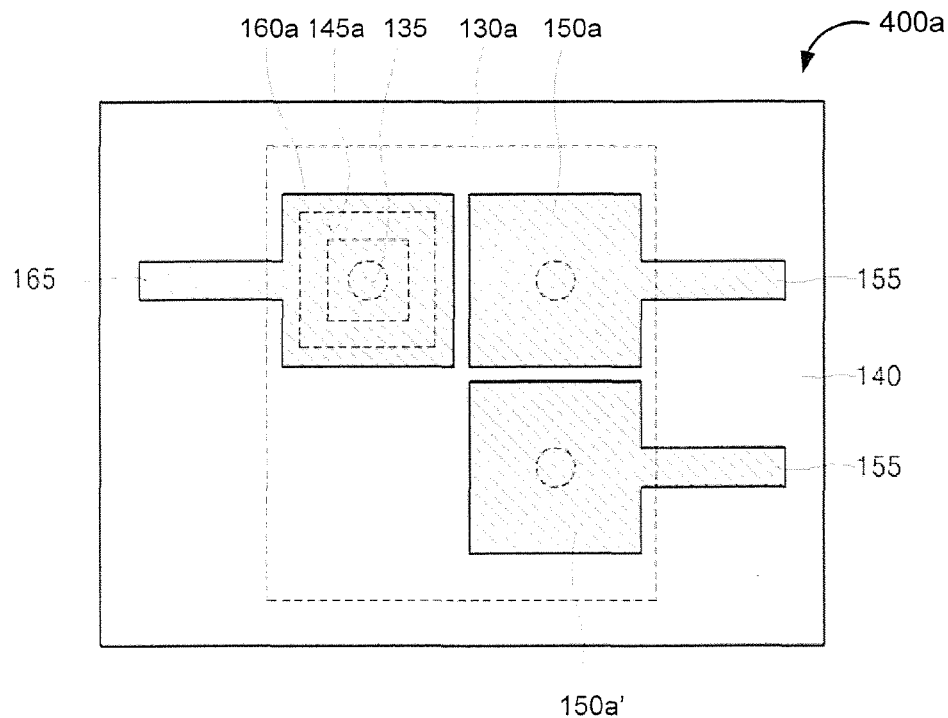
FIGS. 4A-4B are plan views illustrating microelectronic device structures according to still other embodiments of the present invention.
Figure 4B:
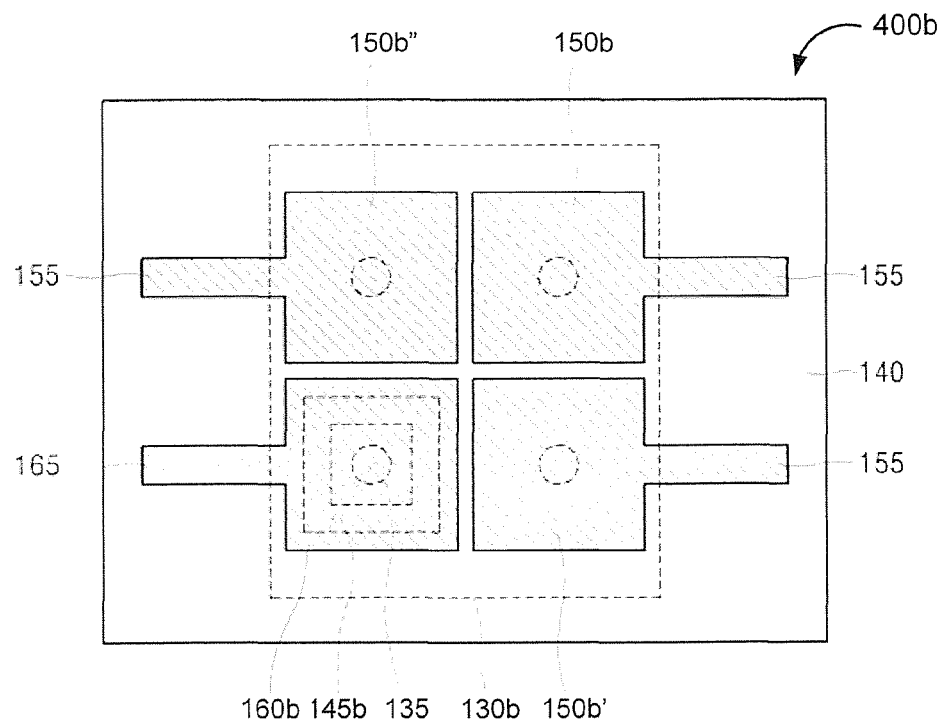

FIGS. 4A-4B illustrate TSV structures according to still other embodiments of the present invention. Referring now to FIGS. 4A-4B, two semiconductor chips 400a and 400b are stacked in a multi-chip module. The semiconductor chips 400a and 400b include respective substrates 110a and 110b and respective conductive pads 130a and 130b thereon. The conductive pad 130a includes three conductive vias 150a, 160a extending therethrough, while the conductive pad 130b includes four conductive vias 150b, 160b extending therethrough. Two conductive vias 150a and 150a' are electrically isolated from the conductive pad 130a, and one conductive via 160a is electrically connected to an exposed portion 145a of the conductive pad 130a. Similarly, three conductive vias 150b, 150b', and 150b" are electrically isolated from the conductive pad 130b, and one conductive via 160b is electrically connected to an exposed portion 145b of the conductive pad 130b.

Still referring to FIGS. 4A and 4B, the conductive via 160a, which is electrically connected to the conductive pad 130a of the semiconductor chip 400a is electrically connected to the conductive via 150b", which is electrically isolated from the conductive pad 130b of the semiconductor chip 400b. As such, a signal from the semiconductor chip 400a can be relayed through the semiconductor chip 400b by the conductive vias 160a and 150b", for example, to a printed circuit board or other substrate (not shown). The conductive via 160b, which is electrically connected to the conductive pad 130b, may provide a signal from the semiconductor chip 400b. Likewise, conductive vias 150a and 150a' are electrically connected to conductive vias 150b and 150b', respectively. Accordingly, signals from other semiconductor chips (not shown) may be relayed through the semiconductor chips 400a and 400b by the conductive vias 150a and 150b, and by the conductive vias 150a' and 150b', which are electrically isolated from the respective conductive pads 130a and 130b through which they extend. Thus, signals from multiple chips may be provided through a single conductive pad 130b, providing increased efficiency without the use of additional pads.

Figure 5:
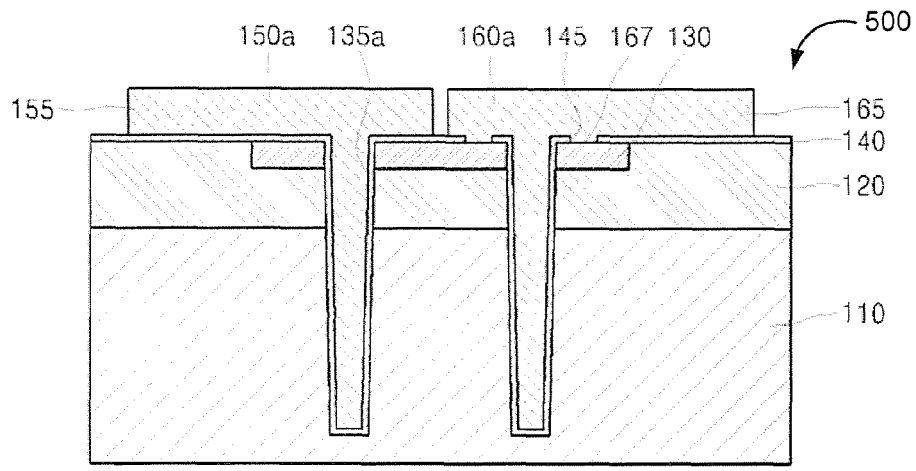
FIGS. 5-9 are cross-sectional views illustrating microelectronic device structures according to still further embodiments of the present invention.

FIG. 5 illustrates a TSV structure according to still further embodiments of the present invention. As shown in FIG. 5, a semiconductor chip 500 includes a substrate 110, an insulation layer 120 on the substrate, a conductive pad 130 on the insulation layer 120, and conductive vias 150a and 160a on the conductive pad 130. The conductive vias 150a and 160a extend through via holes 135a in the conductive pad 130 and the substrate 110. An insulating separation layer 140 between the conductive pad 130 and the conductive vias 150a and 160a electrically isolates the conductive via 150a from the pad 130, but has an opening 145 therein that provides an electrical connection with a portion 167 of the conductive via 160a. The diameter of one or both of the via holes 135a gradually decreases as it extends from a surface of the conductive pad 130 into the substrate 110. In other words, one or more of the via holes 135a may define a tapered opening that narrows as it extends from the conductive pad 130 into the substrate 110. The via holes 135a and the conductive vias 150a and 160a extending therein do not extend completely through the substrate 110 in FIG. 5, but may extend through the substrate 110 after subsequent processing. It will be understood that, although illustrated in FIG. 5 as narrowing as it extends from the conductive pad 130 into the substrate 110, the tapered opening may widen as it extends from the conductive pad 130 into the substrate 110 in some embodiments. Also, it will be understood that the degree of tapering need not be uniform and/or linear.

Figure 6:
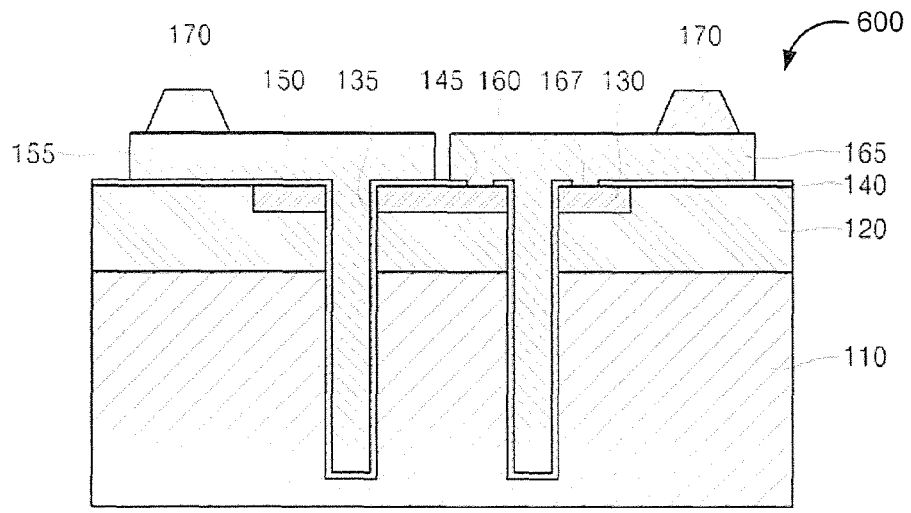

FIG. 6 illustrates a TSV stricture according to yet other embodiments of the present invention. Referring now to FIG. 6, a semiconductor chip 600 includes a substrate 110, an insulation layer 120 on the substrate, a conductive pad 130 on the insulation layer 120, and conductive vias 150 and 160 on the conductive pad 130. The conductive vias 150 and 160 extend through via holes 135 in the conductive pad 130 and the substrate 110. An insulating separation layer 140 between the conductive pad 130 and the conductive vias 150 and 160 electrically isolates the conductive via 150 from the pad 130, but has an opening 145 therein that provides an electrical connection with a portion 167 of the conductive via 160. One or more conductive bumps 170 are provided on portions of the first and second conductive vias 150 and 160 outside of the via holes 135. The conductive bumps 170 may be formed of a material that has a greater ductility than that of the conductive vias 150 and/or 160. For example, the conductive bumps 170 may be solder in some embodiments. As shown in FIG. 6, the conductive bumps 170 are provided on the redistribution lines 155 and 165, for example, to provide greater adhesive strength for physical connections with other devices. However, in embodiments where the redistribution lines 155 and 165 are omitted, the conductive bumps 170 may be provided directly on the conductive vias 150 and/or 160.

Figure 7:
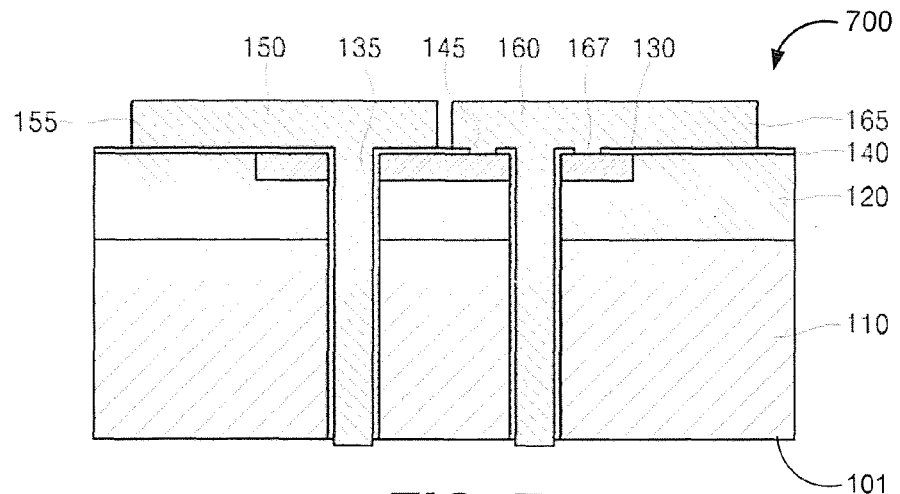

FIG. 7 illustrates a TSV structure according to yet further embodiments of the present invention. Referring now to FIG. 7, a semiconductor chip 700 includes a substrate 110, an insulation layer 120 on the substrate, a conductive pad 130 on the insulation layer 120, and conductive vias 150 and 160 on the conductive pad 130. The conductive vias 150 and 160 extend through via holes 135 in the conductive pad 130 and the substrate 110. An insulating separation layer 140 between the conductive pad 130 and the conductive vias 150 and 160 electrically isolates the conductive via 150 from the pad 130, but has an opening 145 therein that provides an electrical connection with a portion 167 of the conductive via 160. As shown in FIG. 7, the via holes 135 and first and second conductive vias 150 and 160 extend or penetrate completely through the semiconductor substrate 110. Moreover, the conductive vias 150 and 160 protrude from a surface of the substrate 110 opposite the conductive pad 130, such that bottom or lower portions of the conductive vias 150 and 160 are exposed for connection with other chips in a multi-chip stack. For example, the lower surface 101 of the substrate 110 may be recessed to expose the conductive vias 150 and/or 160. Accordingly, the conductive vias 150 and/or 160 may transmit signals to and/or relay signals from other chips.

Figure 8:
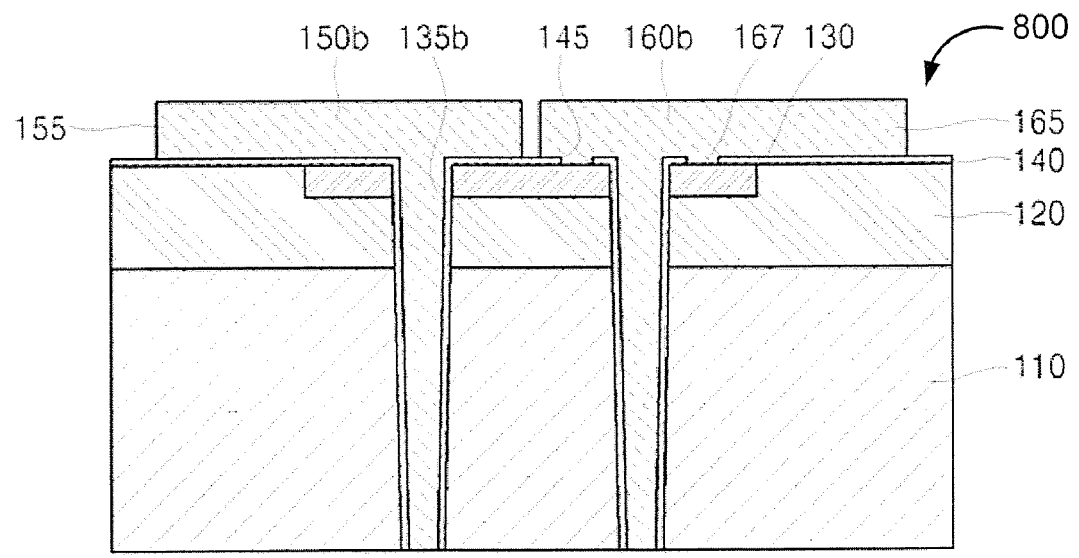

FIG. 8 illustrates TSV structures according to still other embodiments of the present invention. Referring now to FIG. 8, a semiconductor chip 800 includes a substrate 110, an insulation layer 120 on the substrate, a conductive pad 130 on the insulation layer 120, and conductive vias 150*b* and 160*b* on the conductive pad 130. The conductive vias 150*b* and 160*b* extend through via holes 135*b* in the conductive pad 130 and the substrate 110. An insulating separation layer 140 between the conductive pad 130 and the conductive vias 150*b* and 160*b* electrically isolates the conductive via 150*b* from the pad 130, but has an opening 145 therein that provides an electrical connection with a portion 167 of the conductive via 160*b*. As shown in FIG. 8, the via holes 135*b* and first and second conductive vias 150*b* and 160*b* extend or penetrate completely through the semiconductor substrate 110. However, the diameter of one or both of the via holes 135*b* gradually decreases as it extends from a surface of the conductive pad 130 into the substrate 110. In other words, one or more of the via holes 135*b* may define a tapered opening that narrows as it extends from the conductive pad 130 into the substrate 110. However, it will be understood that the degree of tapering need not be uniform and/or linear.

Figure 9:
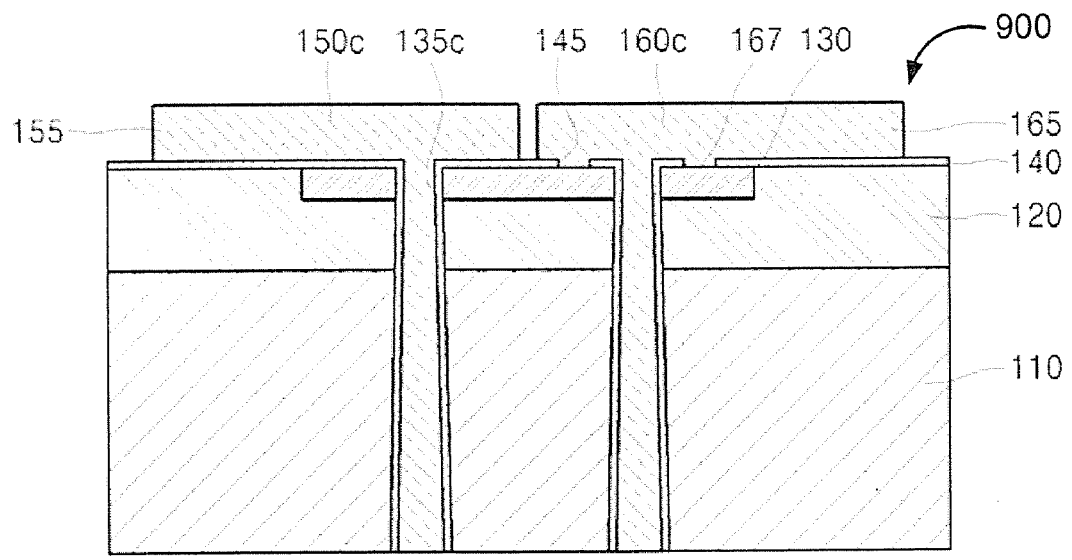

FIG. 9 illustrates TSV structures according to still further embodiments of the present invention. Referring now to FIG. 9, a semiconductor chip 900 includes a substrate 110, an insulation layer 120 on the substrate, a conductive pad 130 on the insulation layer 120, and conductive vias 150*c* and 160*c* on the conductive pad 130. The conductive vias 150*c* and 160*c* extend through via holes 135*c* in the conductive pad 130 and the substrate 110. An insulating separation layer 140 between the conductive pad 130 and the conductive vias 150*c* and 160*c* electrically isolates the conductive via 150*c* from the pad 130, but has an opening 145 therein that provides an electrical connection with a portion 167 of the conductive via 160*c*. As shown in FIG. 9, the via holes 135*c* and first and second conductive vias 150*c* and 160*c* extend or penetrate completely through the semiconductor substrate 110. However, the diameter of one or both of the via holes 135*c* gradually increases as it extends from a surface of the conductive pad 130 into the substrate 110. In other words, one or more of the via holes 135*c* may define a tapered opening that widens as it extends from the conductive pad 130 into the substrate 110. However, it will be understood that the degree of tapering need not be uniform and/or linear.

FIGS. 10A-10D illustrate a multi-chip module (MCM) including TSV strictures according to yet other embodiments of the present invention. In particular, FIG. 10A illustrates a semiconductor chip 100*a* of the MCM 1000 in plan view, FIG. 10B illustrates a semiconductor chip 100*b* of the MCM 1000 in plan view, FIG. 10C illustrates a semiconductor chip 100*c* of the MCM 1000 in plan view, and FIG. 10D illustrates the MCM including the three semiconductor chips 100*c*, 100*b*, and 100*a* sequentially stacked on a module substrate 210 in cross-section. The module substrate 210 may be a printed circuit board (PCB) or film substrate in some embodiments.

As shown in FIG. 10A, the semiconductor chip 100*a* includes two conductive vias 150*a* and 160*a* extending through a openings in a conductive pad 130*a* and a substrate 110*a*. The conductive vias 150*a* and 160*a* extend completely through the substrate 110*a*. The first conductive via 150*a* is electrically isolated from the conductive pad 130*a*, for example, by an insulating separation layer (not shown). The second conductive via 160*a* is electrically connected to the conductive pad 130*a*, for example, by an opening in the insulating separation layer (not shown) as also discussed above.

As shown in FIG. 10B, the semiconductor chip 100*b* includes three conductive vias 150*b*, 150*b*', and 160*b* extending through a openings in a conductive pad 130*b* and a substrate 110*b*. The conductive vias 150*b*, 150*b*', and 160*b* extend completely through the substrate 110*b*. The conductive vias 150*b* and 150*b*' are electrically isolated from the conductive pad 130*b*, while the conductive via 160*b* is electrically connected to the conductive pad 130*b*. The conductive via 150*b* extends through a via hole in the substrate 110*b* to provide an electrical connection with the laterally extending portion of the conductive via 160*a* of FIG. 10A. As such, the conductive via 150*b* may relay a signal from the semiconductor chip 100*a* through the semiconductor chip 100*b*.

As shown in FIG. 10C, the semiconductor chip 100*c* includes four conductive vias 150*c*, 150*c*', 150*c*", and 160*c* extending through a openings in a conductive pad 130*c* and a substrate 110*c*. The conductive vias 150*c*, 150*c*', 150*c*", and 160*c* extend completely through the substrate 110*c* to provide respective electrical connections with the module substrate 210. The conductive vias 150*c*, 150*c*', and 150*c*" and are electrically isolated from the conductive pad 130*c*, while the conductive via 160*c* is electrically connected to the conductive pad 130*c*. The conductive via 150*c* extends through a via hole in the substrate 110*c* to provide an electrical connection with the laterally extending portion of the conductive via 150*b* of FIG. 10B, which is electrically connected to the conductive via 160*a* of FIG. 10A. As such, the conductive via 150*c* may relay a signal from the semiconductor chip 100*a* through the semiconductor chips 100*b* and 100*c* to the module substrate 210. Likewise, the conductive via 150*c*" extends through a via hole in the substrate 110*c* to provide an electrical connection with the laterally extending portion of the conductive via 160*b* of FIG. 10B, and thus, may relay a signal from the semiconductor chip 100*b* through the semiconductor chip 100*c* to the module substrate 210. The conductive via 150*c'* similarly extends through a via hole in the substrate 110*c* to provide an electrical connection with the laterally extending portion of the conductive via 150*b'* of FIG. 10B, and may thereby relay a signal from another chip (not shown) to the module substrate 210. Also, the conductive via 160*c*, which is electrically connected to the conductive pad 130*c*, may provide a signal from the semiconductor chip 100*c* to the module substrate 210.

Thus, by providing multiple conductive vias per pad as shown in FIGS. 10A-10D, the chip 100*c* immediately adjacent to the module substrate 210 may transmit signals to the module substrate 210 (and vice versa) for up to four (or more) semiconductor chips. For example, in embodiments where the semiconductor chips 100*a*-100*c* are of the same type, a chip select (CS) signal may be transmitted to the chips 100*a*, 100*b*, and 100*c*, using the conductive vias 150*c*/150*b*/160*a*, 150*c"*/160*b*, and 160*c*, respectively. More generally, CS signals may be relayed through the conductive vias that are electrically isolated from the conductive pads through which they extend, and may be transmitted to designated semiconductor chips through the conductive vias that are electrically connected to their respective conductive pads. The number of conductive vias per conductive pad may be selected based on the number of semiconductor chips in the MCM. In some embodiments, the number conductive vias extending through the same pad in a semiconductor chip immediately adjacent to the module substrate 210 may correspond to the total number of chips in the MCM stack. Also, one or more conductive bumps 220, such as solder bumps, may be provided on the surface of the module substrate 210 opposite the chip 100*c*.

Figure 11:
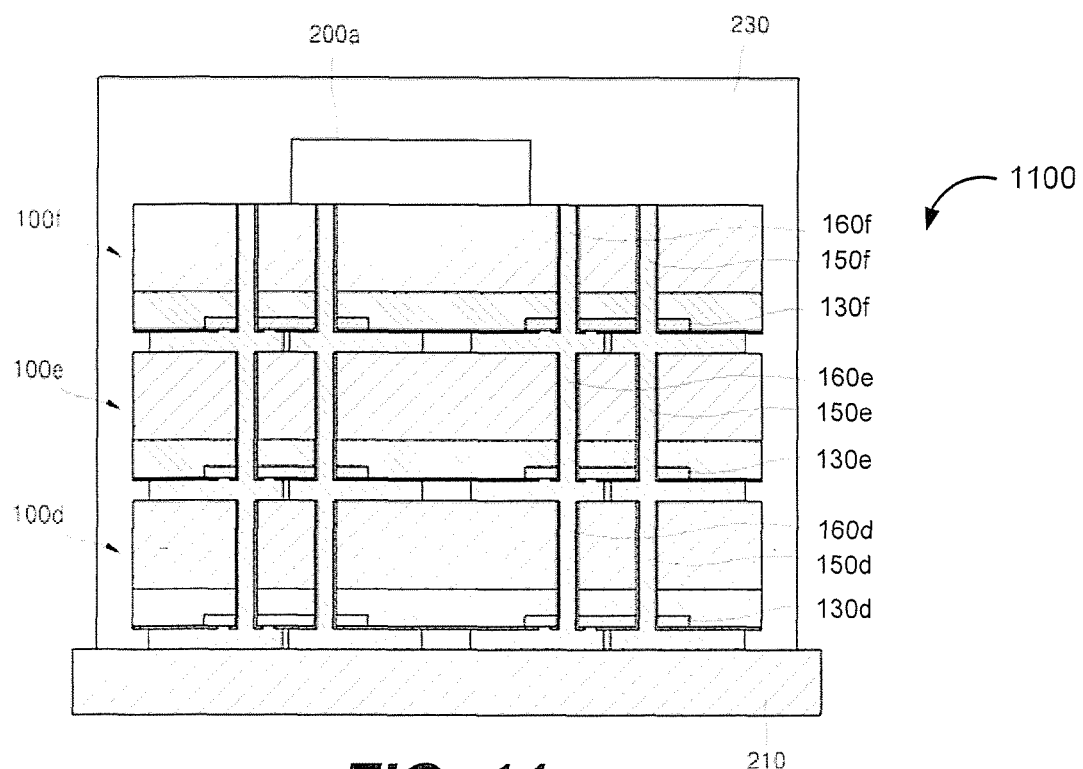
FIGS. 11-12 are cross-sectional views illustrating multi-chip modules including microelectronic device structures according to yet further embodiments of the present invention.

FIG. 11 illustrates a MCM including TSV structures according to yet further embodiments of the present invention. Referring now to FIG. 11, an MCM 1100 includes three semiconductor chips 100*d*, 100*e*, and 100*f* sequentially stacked on a module substrate 210. The semiconductor chips 100*d*-100*f* may respectively include conductive pads 130*d*-130*f* and conductive vias 160*d*-160*f* and 150*d*-150*f* respectively extending therethrough in a manner similar to that described above with reference to the semiconductor chips 100*a*-100*c* of FIG. 10D. Thus, further description of the interconnections between the conductive vias 160*d*-160*f* and 150*d*-150*f* and the module substrate 210 will be omitted for brevity.

As shown in FIG. 11, a semiconductor chip 200*a* is provided on the semiconductor chips 100*d*-100*f* and is electrically to the conductive vias 150*f* and/or 160*f* extending through the chip 100*f*. The semiconductor chip 200*a* may be of a different type than the chips 100*d*-100*f*. For example, the semiconductor chips 100*d*-110*f* may be memory devices, while the semiconductor chip 200*a* may be a memory controller device. Thus, the MCM 1100 may be a system in package (SIP) including memory devices 100*d*-100*f* and control devices 200*a* in a single package. In some embodiments, a molding component 230 may be provided on the module substrate 210 to bind the semiconductor chips 100*d*-100*f* and 200*a*.

Figure 12:
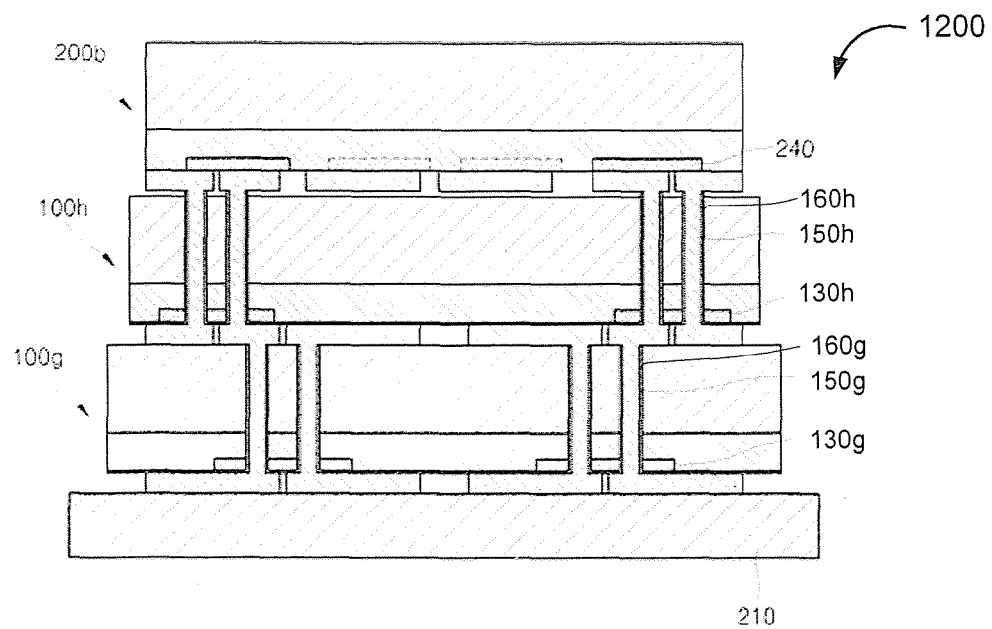

FIG. 12 illustrates a MCM including TSV structures according to yet other embodiments of the present invention. Referring now to FIG. 12, an MCM 1200 includes two semiconductor chips 100*g* and 110*h* and a semiconductor chip 200*b* sequentially stacked on a module substrate 210. The semiconductor chips 100*g* and 100*h* may respectively include conductive pads 130*g* and 130*h* having one or more conductive vias extending therethrough to provide electrical connections between the chips 200*a*, 110*h*, and/or 100*g* and the module substrate 210. In particular, the conductive pad 130*g* may include one or more conductive vias 150*g* electrically isolated therefrom and/or one or more conductive vias 160*g* electrically connected thereto. Likewise, the conductive pad 130*h* may include one or more conductive vias 150*h* electrically isolated therefrom and/or one or more conductive vias 160*h* electrically connected thereto. As shown in FIG. 12, the semiconductor chip 200*b* may have a greater number of conductive pads 240 than the semiconductor chips 100*g* and/or 100*h*. However, as the conductive vias 150*g* and/or 150*h* are electrically isolated from their respective conductive pads 130*g* and 130*h*, signals from multiple pads 240 of the semiconductor chip 200*b* may be transmitted through a single pad 130*g* and/or 130*h* of the semiconductor chips 100*g* and/or 100*h* by providing multiple vias per pad. Thus, an upper chip 200*b* with a greater number of pads 240 can be connected to a substrate 210 through lower chips 100*g* and/or 100*h* with a fewer number of pads 130*g* and/or 130*h*.

Figure 13:
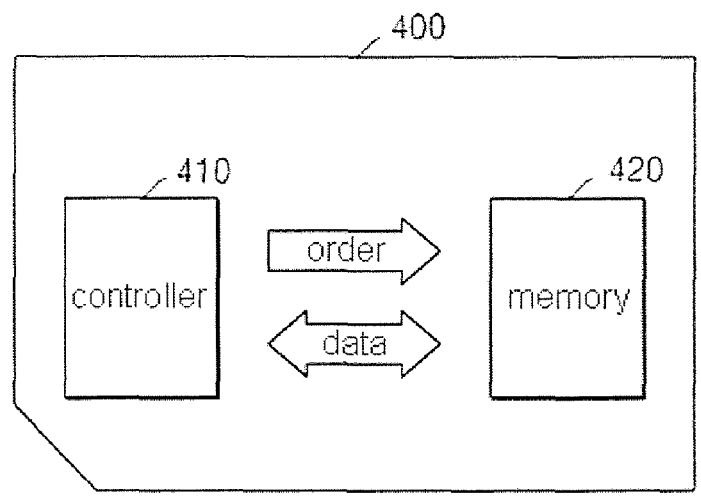
FIG. 13 is a block diagram illustrating a memory card including microelectronic device structures according to some embodiments of the present invention.

FIG. 13 illustrates a memory card including a MCM according to some embodiments of the present invention. As shown in FIG. 13, a memory card 400 includes a controller 410 and a memory device 420 configured to exchange electrical signals. The controller 410 and the memory device 420 may be implemented in a MCM, such as the MCM 1200 of FIG. 12. More particularly, the memory device 420 may be implemented by one of the semiconductor chips 100*g* and/or 100*h* of FIG. 12, while the controller 410 may be implemented by the semiconductor chip 200*b* of FIG. 12. The memory 420 may transmit data responsive to receiving commands from the controller 410. For example, the memory card 400 may save data in the memory 420 or output data from the memory 420 in response to a command from the controller 410. The memory card 400 may be a MMC (multi media card) or SD (secure digital card).

Figure 14:
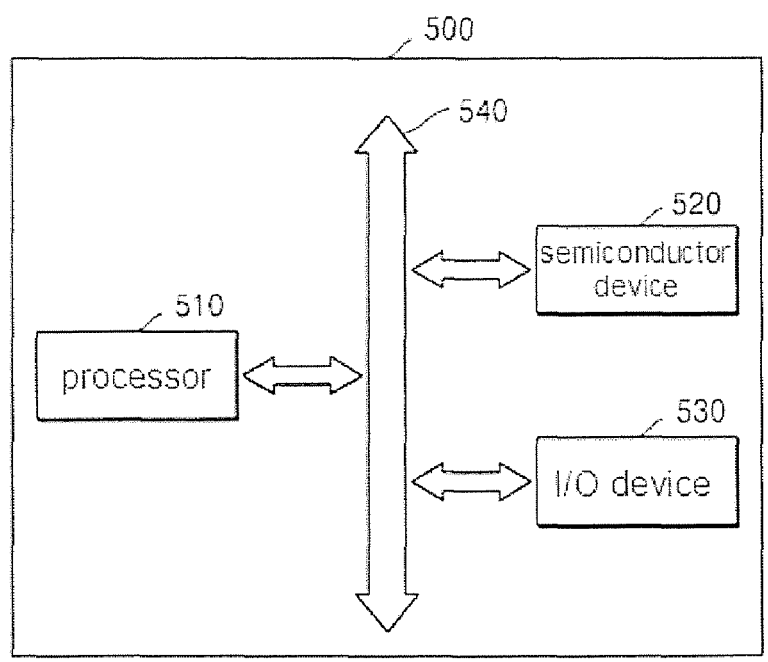
FIG. 14 is a block diagram illustrating a system including microelectronic device structures according to some embodiments of the present invention.

FIG. 14 illustrates a system including a MCM according to some embodiments of the present invention. Referring now to FIG. 14, the system 500 includes a semiconductor memory device 520, a processor 510, and an input/output (I/O) device 530 that communicate via a bus 540. The processor 510 may be configured to execute programs and/or control the system 500. The I/O device 530 may be used for input/output of system data. As such, the system 500 may be configured to exchange data with an external device (such as a personal computer, network, etc.) using the I/O device 530. The memory device 520 may be configured to save code and/or data used in operation of the processor 510. The memory device 520 may be implemented by a MCM, such as the MCM 1200 of FIG. 12. The system 500 may be used in a variety of electronic devices, such as mobile phones, MP3 players, navigation systems, solid state drives, and/or household appliances.

Figure 15A:
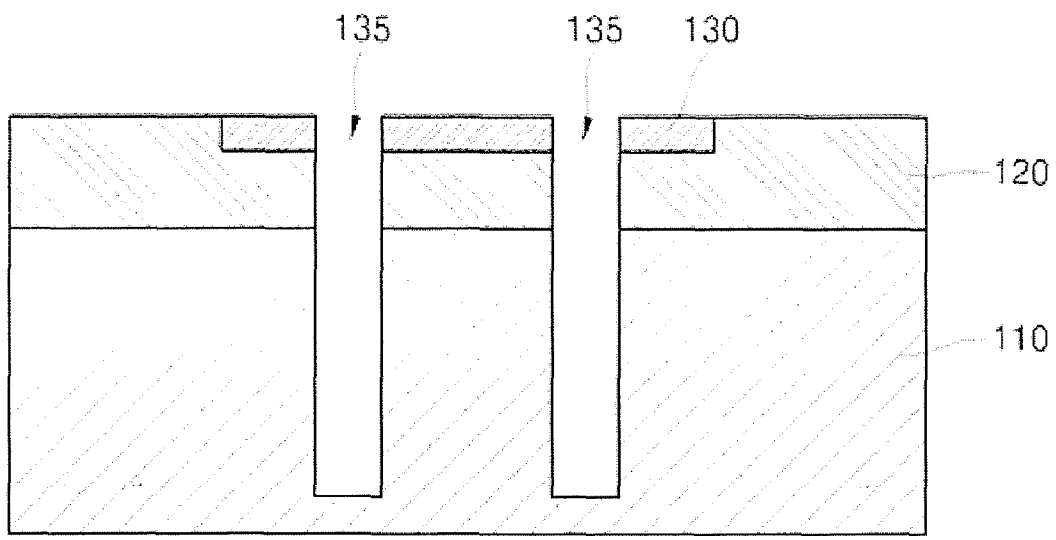
FIGS. 15A-15D are cross sectional views illustrating methods of fabricating microelectronic device structures according to some embodiments of the present invention.

FIGS. 15A-15D illustrate methods of fabricating TSV structures according to some embodiments of the present invention. Referring now to FIG. 15A, an insulation layer 120 is formed on semiconductor substrate 110. The insulation layer may be formed by a deposition method. A conductive pad 130 is formed on the insulation layer 120. The conductive pad 130 may be formed, for example, by forming a trench in the insulation layer 120, forming a conductive layer in the trench, and planarizing the conductive layer. Also, the conductive pad 130 may be formed by forming a conductive layer on the insulation layer 120, and patterning the conductive layer to define the conductive pad 130. At least two via holes 135 are formed to extend through the conductive pad 130 and into semiconductor substrate 110. The via holes 135 may be formed, for example, by laser drilling (which may not require a mask) and/or a dry etch process. However, the via holes 135 do not penetrate or extend completely through the semiconductor substrate 110. The shape of via holes 135 may vary, for example, according to drilling/etching conditions.

Figure 15B:
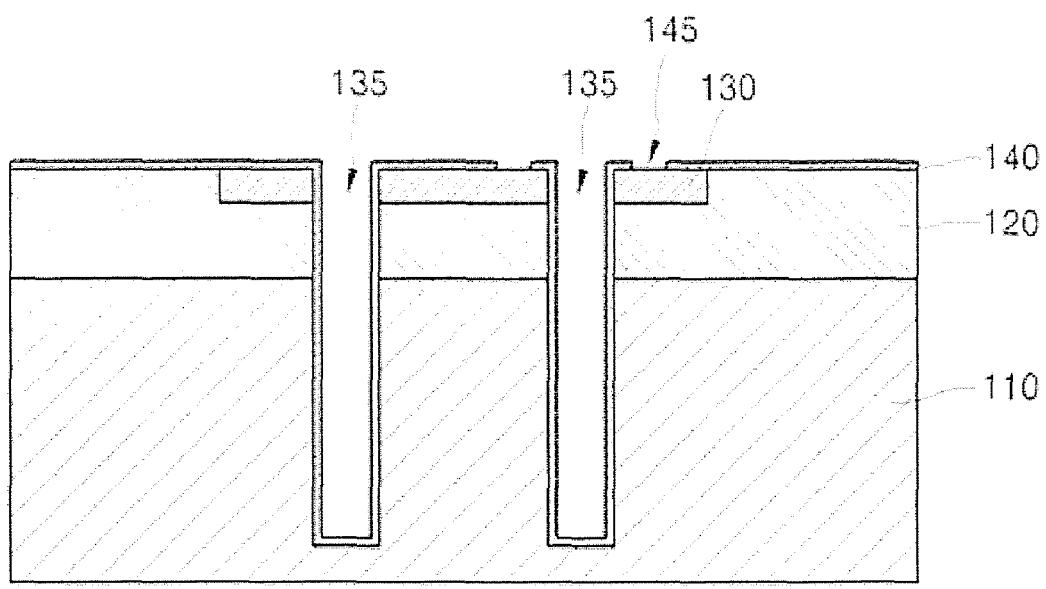

As shown in FIG. 15B, an insulating separation layer 140 is formed on a surface of the conductive pad 130 and in the via holes 135 on opposing sidewalls thereof. The separation layer 140 may be an oxide, nitride, polymer and/or parylene layer, and may be formed by chemical vapor deposition (CVD), polymer spraying, and/or physical vapor deposition (PVD). The separation layer 140 may include an opening therein that exposes a portion 145 of the conductive pad 130 to provide an electrical connection with a conductive via. For example, the separation layer 140 may be patterned to expose the portion 145 of the conductive pad. The exposed portion 145 of the conductive pad 130 may include any shape that allows for electrical contact with the conductive pad 130, for example, an elliptical, rectangular, and/or ring shape.

Figure 15C:
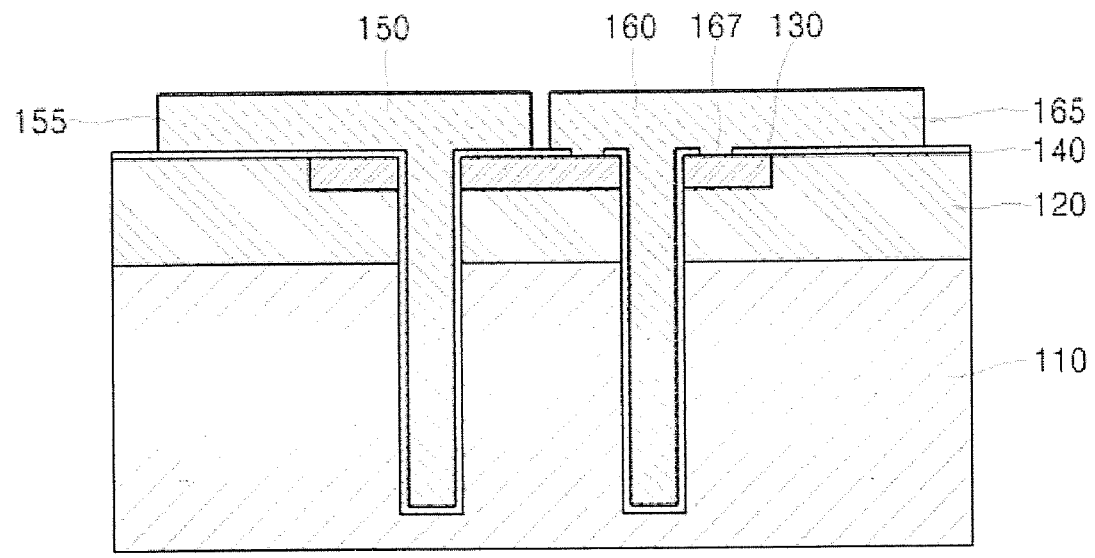

Referring now to FIG. 15C, first and second conductive vias 150 and 160 are formed to extend through the conductive pad 130 and into the substrate 110. The conductive vias 150 and 160 may be formed by forming conductive layer on the separation layer 140 to fill the via holes 135, and patterning the conductive layer to define the conductive vias 150 and 160. Alternatively, the conductive vias 150 and 160 may be formed by forming a seed layer on the substrate 110 and in the via holes 135, forming a mask pattern (such as a photoresist pattern) on portions of the substrate 110, and performing a plating process to define the conductive vias 150 and 160. The conductive vias 150 and 160 respectively include a vertically extending portion that extends through the conductive pad 130 and into the substrate 110, and a laterally extending portion that extends along the surface of the conductive pad 130. The first conductive via 150 is electrically isolated from the conductive pad 130 by the insulating separation layer 140. The second conductive via 160 is electrically connected to the conductive pad 130 through the opening in the separation layer 140. More particularly, a portion 167 of the second conductive via may be in direct contact with the portion 145 of the conductive pad 130 exposed by the opening in the separation layer 140. However, in some embodiments, the separation layer 140 may not include an opening therein, and thus, the second conductive via 160 may also be electrically isolated from the conductive pad 130.

Still referring to FIG. 15C, a first redistribution line 155 is formed along the surface of the insulation layer 120 to provide an electrical connection to the first conductive via 150. A second redistribution line 165 is similarly formed to provide an electrical connection to the second conductive via 160. For example, the conductive vias 150 and 160 and the redistribution lines 155 and 165 may be formed in a same process by forming a conductive layer on the substrate 110 and in the via holes, and patterning the conductive layer to define the conductive vias 150 and 160 and the redistribution lines. The conductive layer for forming the vias 150 and 160 and/or the redistribution lines 155 and 165 may be a barrier metal layer and/or a patterned metal layer. Example materials for the barrier metal layer may include titanium (Ti), tantalum (Ta), titanium nitride (TiN), and/or tantalum nitride (TaN). Example materials for the patterned metal layer may include tungsten (W), aluminum (Al), and/or copper (Cu). Where Cu is used, the Cu layer may be formed by a plating method after forming a seed layer in the via holes 135 and a mask pattern on the substrate 110 outside the via holes. Where Al and/or W is used, a seed layer may not be required.

Figure 15D:
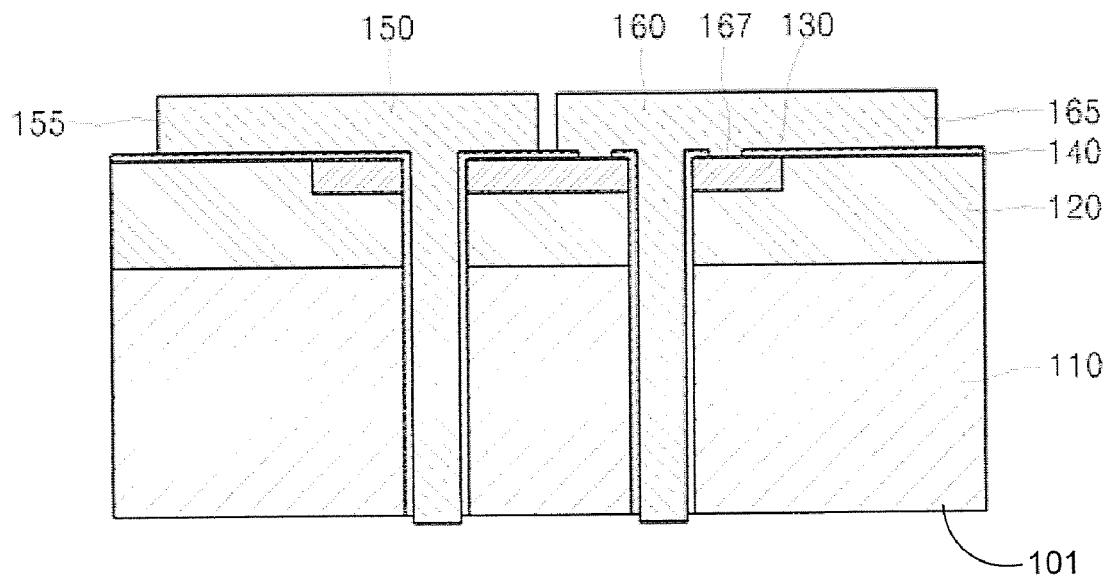

As shown in FIG. 15D, a portion of the substrate 110 opposite the conductive pad 130 is recessed or removed such that the first and second conductive vias 150 and 160 extend completely through the substrate 110. The substrate 110 may be recessed, for example, by a chemical mechanical polishing (CMP) process, an isotropic etching process, and/or an anisotropic etching process. Portions of the insulating separation layer 140 on end portions of the conductive vias 150 and 160 may also be removed at this time, for example, using the same process or a separate process, to expose the end portions of the conductive vias 150 and 160. As such, end portions of the first and second conductive vias 150 and 160 protrude from a lower surface 101 of the substrate 110, for example, to provide electrical connections with other chips when assembled in a multi-chip stack.

Although discussed above in FIGS. 15A-15D with reference to a via-last process, where the conductive vias 150 and 160 are formed after fabrication of transistors, traces, and conductive pads 130, it is to be understood that embodiments of the present invention may also be formed using a via-first process and/or other processes.

Figure 16A:
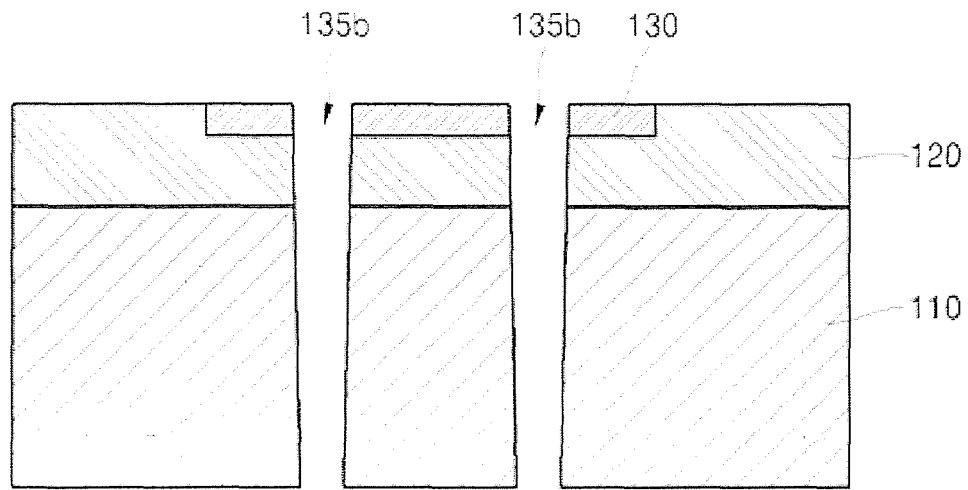
FIGS. 16A-16B are cross sectional views illustrating methods of fabricating semiconductor device structures according to other embodiments of the present invention.
Figure 16B:
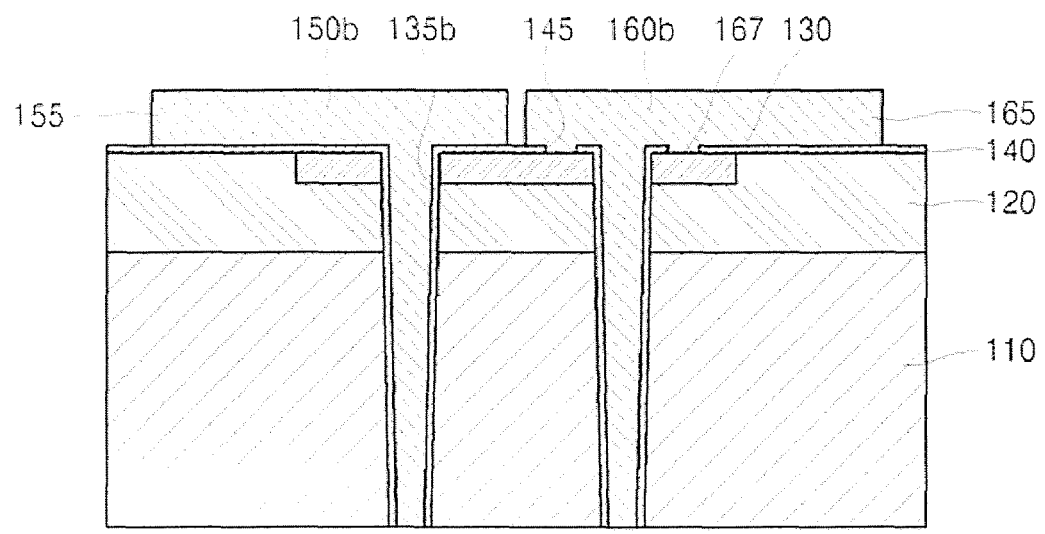

FIGS. 16A-16B illustrates methods of fabricating TSV structures according to other embodiments of the present invention. Referring to FIG. 16A, the insulation layer 120 and the conductive pad 130 are formed on the semiconductor substrate 110, and via holes 135b are formed to extend through the conductive pad 130 and completely through the substrate 110 using an anisotropic etching process. More particularly, the conductive pad 130, the insulation layer 120, and the substrate 110 are successively anisotropically etched such that a width or diameter of the via holes 135b decreases as the via holes 135b extend into the substrate 110. In other words, the via holes 135b define tapered openings that narrow as they extend into the substrate 110. As shown in FIG. 16B, an insulating separation layer 140 and conductive vias 150b and 160b are formed as described above with reference to FIGS. 15A-15D. However, due to the tapered via holes 135b, the conductive vias 150b and 160b respectively include a vertically extending portion having a width or diameter that narrows as it extends into the substrate 110 away from the conductive pad 130.

Figure 17A:
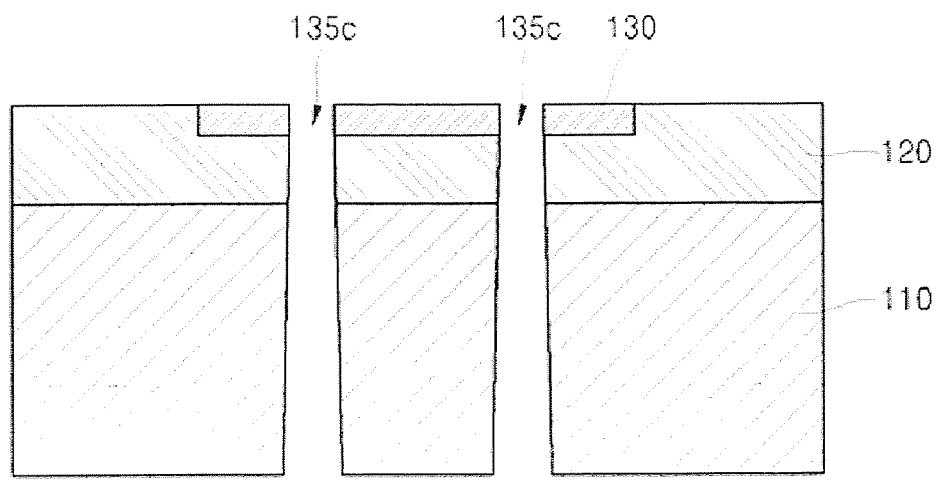
FIGS. 17A-17B are cross sectional views illustrating methods of fabricating microelectronic device strictures according to further embodiments of the present invention.
Figure 17B:
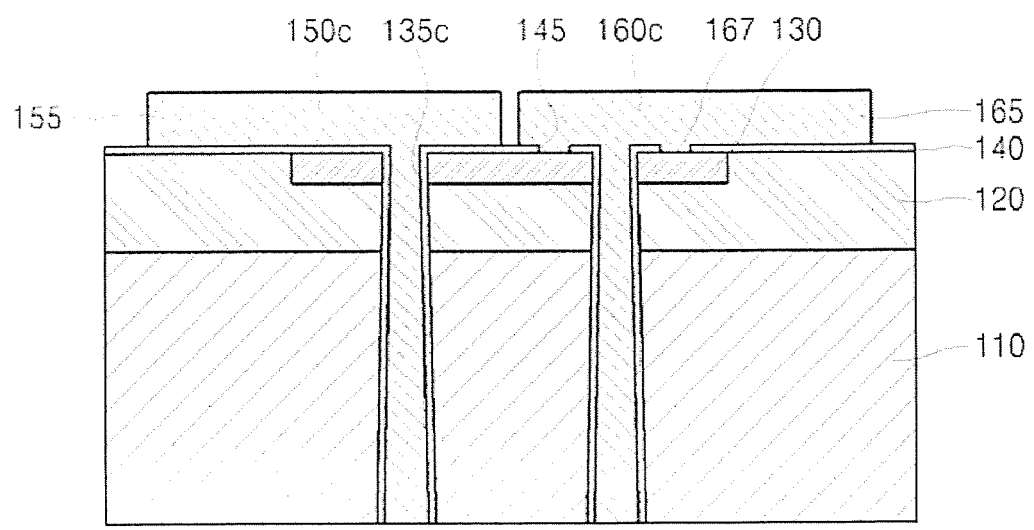

FIGS. 17A-17B illustrates methods of fabricating TSV structures according to further embodiments of the present invention. Referring to FIG. 17A, the insulation layer 120 and the conductive pad 130 are formed on the semiconductor substrate 110, and via holes 135c are formed to extend through the conductive pad 130 and completely through the substrate 110 using an anisotropic etching process. More particularly, the substrate 110, the insulation layer 120, and the conductive pad 130 are successively anisotropically etched such that a width or diameter of the via holes 135c increases as the via holes 135c extend into the substrate 110 away from the conductive pad 130. In other words, the via holes 135c define tapered openings that widen as they extend into the substrate 110. As shown in FIG. 17B, an insulating separation layer 140 and conductive vias 150c and 160c are formed as described above with reference to FIGS. 15A-15D. However, due to the tapered via holes 135c, the conductive vias 150c and 160c respectively include a vertically extending portion having a width or diameter that widens as it extends into the substrate 110 away from the conductive pad 130.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed:

1. A microelectronic structure, comprising:
a substrate;
a conductive pad on the substrate, the conductive pad including first and second openings extending therethrough;
a first conductive via on the conductive pad and extending through the first opening in the conductive pad into the substrate;
a second conductive via on the conductive pad adjacent the first conductive via and extending through the second opening in the conductive pad into the substrate; and
an insulating layer on the conductive pad between the conductive pad and the first and second conductive vias,
wherein the first conductive via is electrically isolated from the conductive pad by the insulating layer.

2. The structure of claim 1, wherein the insulating layer exposes a portion of the conductive pad adjacent the second opening, and wherein the second conductive via is electrically connected to the exposed portion of the conductive pad.

3. The structure of claim 2, wherein the exposed portion of the conductive pad comprises a square shape, a circular shape, a hexagonal shape, or a ring shape in plan view.

4. The structure of claim 1, wherein the second conductive via is electrically isolated from the conductive pad by the insulating layer.

5. The structure of claim 1, further comprising:
a third conductive via adjacent the first and second conductive vias on the conductive pad and extending through a third opening in the conductive pad into the substrate, wherein the third conductive via is electrically isolated from the conductive pad by the insulating layer.

6. A microelectronic structure, comprising:
a substrate;
a conductive pad on the substrate, the conductive pad including first and second openings extending therethrough,
a first conductive via on the conductive pad and extending through the first opening in the conductive pad into the substrate; and
a second conductive via on the conductive pad adjacent the first conductive via and extending through the second opening in the conductive pad into the substrate,
wherein the first and/or second conductive vias respectively comprise a vertically extending portion that extends through the conductive pad and into the substrate, and a laterally extending portion that extends along a surface of the conductive pad outside the first and/or second opening.

7. The structure of claim 6, further comprising:
a conductive bump on at least one of the first and second conductive vias,
wherein the conductive bump has a greater ductility than that of the first and second conductive vias.

8. The structure of claim 1, wherein the first and/or second conductive vias do not extend completely through the substrate.

9. A microelectronic structure, comprising:
a substrate;
a conductive pad on the substrate, the conductive pad including first and second openings extending therethrough;
a first conductive via on the conductive pad and extending through the first opening in the conductive pad into the substrate; and
a second conductive via on the conductive pad adjacent the first conductive via and extending through the second opening in the conductive pad into the substrate,
wherein the first and/or second conductive vias extend completely through the substrate.

10. The structure of claim 9, wherein an exposed portion of the first and/or second conductive vias protrudes from a surface of the substrate opposite the conductive pad.

11. A microelectronic structure, comprising:
a substrate;
a conductive pad on the substrate, the conductive pad including first and second openings extending therethrough;
a first conductive via on the conductive pad and extending through the first opening in the conductive pad into the substrate; and
a second conductive via on the conductive pad adjacent the first conductive via and extending through the second opening in the conductive pad into the substrate,
wherein the first and/or second openings in the conductive pad comprise a tapered opening extending into the substrate.

12. A multi-chip module, comprising:
a module substrate;
a first semiconductor chip on the module substrate, the first semiconductor chip comprising a first conductive pad on a first substrate and including first and second openings extending through the first conductive pad and the first substrate;
a first conductive via on the conductive pad and extending through the first opening to provide an electrical connection to the module substrate; and
a second conductive via on the conductive pad adjacent the first conductive via and extending through the second opening to provide an electrical connection to the module substrate.

13. The module of claim 12, wherein the first conductive via is electrically isolated from the first conductive pad, and wherein the second conductive via is electrically connected to the first conductive pad.

14. The module of claim 12, further comprising:
a second semiconductor chip on the first semiconductor chip, the second semiconductor chip comprising a second conductive pad on a second substrate and including a third opening extending through the second conductive pad and the second substrate,
wherein the first conductive via further extends through the third opening and is electrically connected to the second conductive pad.

15. The module of claim 14, wherein the first semiconductor chip includes a fourth opening extending through the first conductive pad and the first substrate, wherein the second semiconductor chip includes a fifth opening extending through the second conductive pad and the second substrate, and further comprising:
a third semiconductor chip on the second semiconductor chip, the third semiconductor chip comprising a third conductive pad on a third substrate and including a sixth opening extending through the third conductive pad and the third substrate; and
a third conductive via extending through the fourth, fifth, and sixth openings in the first, second, and third semiconductor substrates, respectively, to provide an electrical connection to the module substrate.

16. The module of claim 15, further comprising:
a molding layer on the first, second, and third semiconductor chips on the module substrate.

17. The module of claim 14, wherein the module comprises a system in package (SIP) module, wherein one of the first and second semiconductor chips comprises a memory device, and wherein the other of the first and second semiconductor chips comprises a memory controller.

18. A memory card comprising the module including the memory controller and the memory device of claim 17.

19. A system comprising the module of claim 17, and further comprising:
- a processor;
- an input/output device; and
- a bus configured to provide communication between the module, the processor, and the input/output device.

20. A method of fabricating an integrated circuit device, the method comprising:
- forming a conductive pad on a substrate;
- forming first and second openings extending through the conductive pad and into the substrate;
- forming a first conductive via on the conductive pad and extending through the first opening in the conductive pad into the substrate; and
- forming a second conductive via on the conductive pad adjacent the first conductive via and extending through the second opening in the conductive pad into the substrate.

21. The method of claim 20, further comprising the following prior to forming the first and second conductive vias:
- forming an insulating layer on a surface of the conductive pad and on opposing sidewalls of the first and second openings,
- wherein forming the first conductive via comprises forming the first conductive via on the insulating layer such that the insulating layer electrically isolates the first conductive via from the conductive pad.

22. The method of claim 21, further comprising the following prior to forming the second conductive via:
- patterning the insulating layer to expose a surface of the conductive pad adjacent the second opening in the conductive pad,
- wherein forming the second conductive via comprises forming the second conductive via on the exposed surface of the conductive pad and electrically connected thereto.

23. The method of claim 21, wherein forming the second conductive via comprises forming the second conductive via on the insulating layer such that the insulating layer electrically isolates the second conductive via from the conductive pad.

24. The method of claim 21, wherein forming the first and second conductive vias comprises:
- forming a conductive layer on the insulating layer and in the first and second openings in the conductive pad; and
- patterning the conductive layer to define the first and second conductive vias.

25. The method of claim 21, wherein forming the first and second conductive vias comprises:
- forming a seed layer on the substrate and in the first and second openings; and
- forming a mask pattern on the substrate exposing portions thereof; and
- plating a metal on the seed layer to define the first and second conductive vias in the first and second openings and on the exposed portions of the substrate.

26. The method of claim 21, further comprising:
- forming a third opening in the conductive pad and extending into the substrate; and
- forming a third conductive via on the insulating layer adjacent the first and second conductive vias and extending through the third opening into the substrate, wherein the third conductive via is electrically isolated from the conductive pad by the insulating layer.

27. The method of claim 20, wherein forming the first and second conductive vias further comprises:
- forming the first conductive via to include a vertically extending portion that extends through the conductive pad and into the substrate and a laterally extending portion that extends along a surface of the conductive pad; and
- forming the second conductive via to include a vertically extending portion that extends through the conductive pad and into the substrate and a laterally extending portion that extends along a surface of the conductive pad.

28. The method of claim 20, further comprising:
- removing a portion of a surface of the substrate opposite the conductive pad such that the first conductive via and/or the second conductive via extends completely through the substrate.

29. The method of claim 20, wherein forming the first and second openings in the conductive pad comprises forming first and second tapered openings extending into the substrate.

30. The method of claim 29, wherein forming the first and second tapered openings comprises:
- anisotropically etching the conductive pad and the substrate to form the first and second openings extending therein.

* * * * *